United States Patent
Kim

(10) Patent No.: US 9,105,877 B2
(45) Date of Patent: Aug. 11, 2015

(54) ORGANIC LIGHT-EMITTING DIODE DISPLAY AND METHOD OF MANUFACTURING THE SAME

(71) Applicant: Samsung Display Co., Ltd., Yongin, Gyeonggi-Do (KR)

(72) Inventor: Suk Kim, Hwaseong-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/058,431

(22) Filed: Oct. 21, 2013

(65) Prior Publication Data
US 2015/0014634 A1    Jan. 15, 2015

(30) Foreign Application Priority Data
Jul. 12, 2013    (KR) .................. 10-2013-0082311

(51) Int. Cl.
*H01L 51/56* (2006.01)
*H01L 51/00* (2006.01)
*H01L 51/52* (2006.01)

(52) U.S. Cl.
CPC ............ *H01L 51/56* (2013.01); *H01L 51/0023* (2013.01); *H01L 51/5203* (2013.01)

(58) Field of Classification Search
CPC .......... H01L 51/50; H01L 21/31; H01L 51/56
USPC ................. 257/40, 88, E51.018; 438/34, 761
See application file for complete search history.

(56) References Cited

U.S. PATENT DOCUMENTS

| | | | |
|---|---|---|---|
| 2011/0042695 A1* | 2/2011 | Oyamada | 257/88 |
| 2012/0091439 A1* | 4/2012 | Nishiyama et al. | 257/40 |
| 2012/0187389 A1* | 7/2012 | Shoda et al. | 257/40 |
| 2014/0361280 A1* | 12/2014 | Kuribe et al. | 257/40 |

FOREIGN PATENT DOCUMENTS

| | | | |
|---|---|---|---|
| JP | WO2013103093 | * 11/2013 | 257/40 |
| KR | 1020040081164 A | 9/2004 | |
| KR | 1020060113735 A | 11/2006 | |
| KR | 1020110087829 A | 8/2011 | |

* cited by examiner

*Primary Examiner* — Karen Kusumakar
*Assistant Examiner* — Adam S Bowen
(74) *Attorney, Agent, or Firm* — Cantor Colburn LLP

(57) ABSTRACT

An organic light-emitting diode display includes a substrate, a first electrode which is disposed on the substrate, a trench defined in a top surface of the first electrode, and a hole injection layer which is disposed in the trench.

21 Claims, 15 Drawing Sheets

ORGANIC LIGHT-EMITTING DIODE DISPLAY AND METHOD OF MANUFACTURING THE SAME

This application claims priority to Korean Patent Application No. 10-2013-0082311 filed on Jul. 12, 2013, and all the benefits accruing therefrom under 35 U.S.C. §119, the disclosure of which is incorporated herein by reference in its entirety.

BACKGROUND

1. Field

The invention relates to an organic light-emitting diode display ("OLED") and a method of manufacturing the same.

2. Description of the Related Art

Demands for displays have been increased due to a development of information and communications technology and diverse needs of an information society. Cathode ray tubes ("CRTs"), which were once the most common type of displays, are being replaced by flat panel displays ("FPDs") to meet demands for more compact and less power-consuming displays. Some of the most widely used FPDs include electroluminescent displays ("ELDs"), liquid crystal displays ("LCDs"), plasma display panels ("PDPs"), and organic light-emitting diode displays ("OLEDs").

In particular, OLEDs can be driven at a low voltage and have a wide viewing angle and a short response time. Due to these advantages, OLEDs are used in an increasingly wide range of applications. A conventional OLED may include an anode, a cathode and an organic layer interposed between the anode and the cathode. In the organic layer, holes supplied from the anode and electrons supplied from the cathode may combine to form excitons. The organic layer emits light due to energy generated when the excitons return to a ground state.

SUMMARY

Exemplary embodiment of the invention provide an organic light-emitting diode display ("OLED") having improved hole injection efficiency.

Exemplary embodiments of the invention also provide a method of manufacturing an OLED having improved hole injection efficiency.

However, exemplary embodiments of the invention are not restricted to the one set forth herein. The above and other exemplary embodiments of the invention will become more apparent to one of ordinary skill in the art to which the invention pertains by referencing the detailed description of the invention given below.

According to an exemplary embodiment of the invention, there is provided an OLED including a substrate, a first electrode which is disposed on the substrate and a trench defined in a top surface thereof, and a hole injection layer which is disposed in the trench.

According to another exemplary embodiment of the invention, there is provided an OLED including a substrate, a plurality of pixels which is defined on the substrate, a first electrode which is disposed on the substrate in each of the pixels and has a trench defined in a top surface thereof, a pixel defining layer which is disposed on the first electrode at a boundary of each pixel and defines openings, each exposing the trench of the first electrode, a hole injection layer which is disposed in the trench of the first electrode, an organic light-emitting layer which is disposed on the hole injection layer, and a second electrode which is disposed on the organic light-emitting layer.

According to still another exemplary embodiments of the invention, there is provided a method of manufacturing an OLED, the method comprising forming a first electrode, which has a trench in a top surface thereof, on a substrate, and forming a hole injection layer in the trench.

BRIEF DESCRIPTION OF THE DRAWINGS

The above and other aspects, advantages and features of the invention will become more apparent by describing in detail exemplary embodiments thereof with reference to the attached drawings, in which.

DETAILED DESCRIPTION

Figure 1:
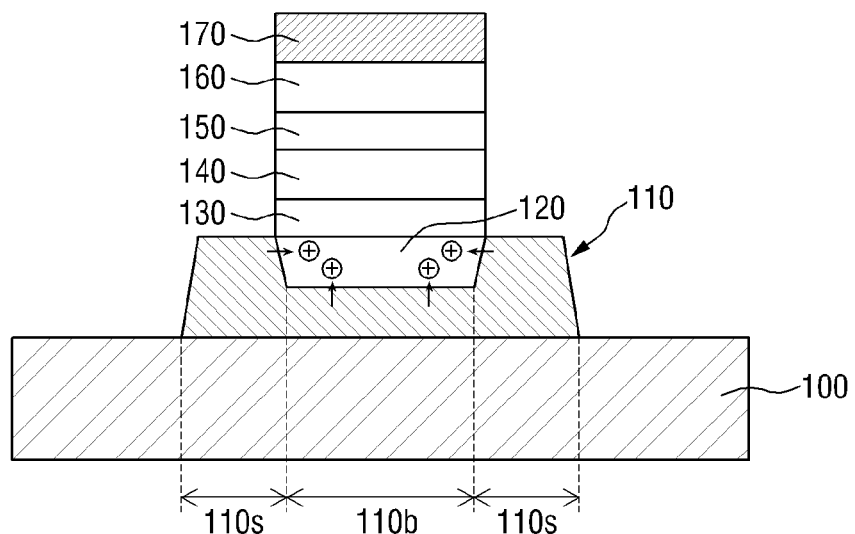
FIG. 1 is a schematic cross-sectional view of an exemplary embodiment of an organic light-emitting diode display ("OLED") according to the invention.

Light-emission efficiency increases as the injection efficiency of holes from the anode to the organic layer increases. Thus, a hole injection layer may be provided between the anode and the organic layer in order to increase the hole injection efficiency. However, when the hole injection layer is not placed at an exact position, sufficient hole injection efficiency cannot be ensured.

Advantages and features of the invention and methods of accomplishing the same may be understood more readily by reference to the following detailed description of exemplary embodiments and the accompanying drawings. The invention may, however, be embodied in many different forms and should not be construed as being limited to the exemplary embodiments set forth herein. Rather, these exemplary embodiments are provided so that this disclosure will be thorough and complete and will fully convey the concept of the invention to those skilled in the art, and the invention will only be defined by the appended claims.

It will also be understood that when a layer is referred to as being "on" another layer or substrate, it can be directly on the other layer or substrate, or intervening layers may also be present. The same reference numbers indicate the same components throughout the specification.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Organic light-emitting diode displays ("OLEDs") according to exemplary embodiments of the invention may be bottom-emission type OLEDs which emit light in a rearward direction (i.e., a direction toward a substrate), top-emission type OLEDs which emit light in a forward direction (i.e., a direction toward a second electrode), or dual-emission type OLEDs which emit light in both the rearward direction and the forward direction.

Hereinafter, exemplary embodiments of the invention will be described in detail with reference to the attached drawings.

FIG. 1 is a schematic cross-sectional view of an OLED 10 according to an exemplary embodiment of the invention. Referring to FIG. 1, the OLED 10 includes a substrate 100, a first electrode 110 which is disposed on the substrate 100 in which a trench is defined, a hole injection layer 120 which is disposed on the first electrode 110, an organic light-emitting layer 140 which is disposed on the hole injection layer 120, and a second electrode 170 which is disposed on the organic light-emitting layer 140.

The substrate 100 supports structures disposed thereon. The substrate 100 may be an insulating substrate. The insulating substrate may include, e.g., glass, plastic, etc. In a bottom-emission type OLED, a transparent substrate may be used. In a top-emission type OLED, a semi-transparent or opaque substrate as well as a transparent substrate may be used.

The first electrode 110 is disposed on the substrate 100. The first electrode 110 may be disposed in each pixel of the OLED 10. Although not shown in FIG. 1, the first electrode 110 may be connected to at least one switch device disposed between the substrate 100 and the first electrode 110 and thus receive a driving voltage or a driving current.

The first electrode 110 faces the second electrode 170 with the organic light-emitting layer 140 interposed therebetween. Any one of the first electrode 110 and the second electrode 170 may be an anode, and the other one may be a cathode. In the illustrated exemplary embodiment, the first electrode 110 may be an anode, and the second electrode 170 may be a cathode.

The first electrode 110 may include a conductive layer having a relatively high work function compared with the second electrode 170. In an exemplary embodiment, the first electrode 110 may include an indium tin oxide ("ITO") layer, an indium zinc oxide ("IZO") layer, a zinc oxide ("ZnO") layer, an indium oxide layer or any combinations thereof. These exemplary conductive layers have relatively high work functions and are transparent. Therefore, when the OLED 10 is of a bottom-emission type or a dual-emission type, the first electrode 110 may include any one of the exemplary conductive layers or a stack of the exemplary conductive layers. When the OLED 10 is of a top-emission type, a layer having a reflective function may further be provided under the exemplary conductive layers. The layer having the reflective function may include, for example, silver (Ag), magnesium (Mg), aluminum (Al), platinum (Pt), lead (Pd), gold (Au), nickel (Ni), neodymium (Nd), iridium (Ir), chrome (Cr), lithium (Li), calcium (Ca) or any combinations thereof.

A trench may be defined in a portion of a top surface of the first electrode 110. In an exemplary embodiment, the trench may be defined in a central portion of the top surface of the first electrode 110. The first electrode 110 may include a bottom portion 110b and sidewalls 110s. The trench may be defined by a top surface of the bottom portion 110b and inner side surfaces of the sidewalls 110s. The top surface of the bottom portion 110b and the inner side surfaces of the sidewalls 110s may contact the hole injection layer 120 and may respectively include a conductive layer having a high work function. Further, a portion of the top surface of the first electrode 110 in which the trench is not defined (i.e., top surfaces of the sidewalls 110s of the first electrode 110) may also include the conductive layer having a high work function.

In the cross-sectional view of FIG. 1, both sidewalls 110s of the first electrode 110 are illustrated as being separated from each other by the bottom portion 110b. However, both sidewalls 110s of the first electrode 110 may be a part having a closed curve (e.g., a quadrangle) that surrounds the bottom portion 110b in a plan view (e.g., top view), and thus may actually be physically connected to each other when viewed from above.

The hole injection layer 120 is disposed on the first electrode 110. The hole injection layer 120 may increase an injection efficiency of holes from the first electrode 110 into the organic light-emitting layer 140. That is, the hole injection layer 120 may ensure more effective injection of holes by lowering an energy barrier.

The hole injection layer 120 may include a phthalocyanine compound such as copper phthalocyanine ("CuPc"), 4,4',4"-tris(N-3-methylphenyl-N-phenyl-amino)-triphenylamine ("m-MTDATA"), 4,4'4"-Tris(N,N-diphenylamino)triphenylamine ("TDATA"), 4,4',4"-Tris-(N-(naphthylen-2-yl)-N-phenylamine)triphenylamine ("2-TNATA"), polyaniline/dodecylbenzenesulfonic acid ("Pani/DBSA"), poly(3,4-ethylenedioxythiophene/poly(4-styrenesulfonate ("PEDOT/PSS"), polyaniline/camphorsulfonic acid ("Pani/CSA") or polyaniline/poly (4-styrene-sulfonate)("PANI/PSS"). However, the material included in the hole injection layer 120 is not limited to the above exemplary embodiments, and any material that facilitates injection of holes can be used for the hole injection layer 120.

The hole injection layer 120 may fill the trench defined in the first electrode 110. The hole injection layer 120 disposed on the trench may be surrounded by the first electrode 110. In an exemplary embodiment, the hole injection layer 120 may completely fill the trench, and a thickness of the hole injection layer 120 may be substantially equal to a depth of the trench. Therefore, a top surface of the hole injection layer 120 may be at substantially the same level as a top surface of the first electrode 110 (i.e., the top surfaces of the sidewalls 110s). An exemplary thickness of the hole injection layer 120 may range from approximately 100 Angstroms (Å) to approximately 10000 Å or from approximately 100 Å to approximately 1000 Å.

In the illustrated exemplary embodiment, the hole injection layer 120 may contact the first electrode 110 at two or more surfaces. As the number of contact surfaces between the first electrode 110 and the hole injection layer 120 increases, hole injection efficiency may be improved. Specifically, the hole injection layer 120 may contact the top surface of the bottom portion 110b of the first electrode 110 and the inner side surfaces of the sidewalls 110s of the first electrode 110, and holes may be injected not only from the top surface of the bottom portion 110b of the first electrode 110 but also from the inner side surfaces of the sidewalls 110s of the first electrode 110 into the hole injection layer 120. Therefore, holes can be injected into a larger area of the hole injection layer 120, compared with when the hole injection layer 120 contacts only one surface of the first electrode 110, for example, the top surface of the bottom portion 110b of the first electrode 110. As a result, hole injection efficiency can be improved. Furthermore, since the hole injection layer 120 is disposed in the trench of the first electrode 110, it can be effectively prevented from being misaligned with the first electrode 110.

A hole transport layer 130 may be disposed on the hole injection layer 120. The hole transport layer 130 may transport holes injected into the hole injection layer 120 to the organic light-emitting layer 140. The hole transport layer 130 may have optimum hole transport efficiency when its highest occupied molecular energy ("HOMO") is substantially lower than a work function of the material included in the first electrode 110 and is substantially higher than the HOMO of the organic light-emitting layer 140. The hole transport layer 130 may include, but not limited to, N,N'-dinaphthyl-N,N'-diphenylbenzidine ("NPD"), N,N'-bis(3-methylphenyl)-N,N'-bis-(phenyl)-benzidine ("TPD"), s-TAD, MTDATA or any combinations thereof.

The organic light-emitting layer 140 is disposed on the hole transport layer 130. The organic light-emitting layer 140 may include a host and a dopant. The host may include, for example, tris(8-quinolinorate)aluminum ("Alq3"), 4,4'-N,N'-dicarbazole-biphenyl ("CBP"), poly(n-vinylcarbazole) ("PVK"), or distyrylarylene ("DSA"). Both a fluorescent dopant and a known phosphorous dopant may be used as the dopant. The type of the dopant may vary according to a color of light emitted from the organic light-emitting layer 140. A red dopant may include, for example, PtOEP, Ir(pig)$_3$, Btp2Ir (acac), or 4-(Dicyanomethylene)-2-tert-butyl-6-(1,1,7,7,-tetramethyljulolidyl-9-enyl)-4H-pyran ("DCJTB"). A green dopant may include, for example, Ir(ppy)$_3$ (ppy=phenylpyridine), Ir(ppy)$_2$(acac), or Ir(mpyp)$_3$. A blue dopant may include, for example, F$_2$Irpic, (F$_2$ ppy)$_2$Ir(tmd), Ir(dfppz)$_3$, or ter-fluorene.

An electron transport layer 150 is disposed on the organic light-emitting layer 140. The electron transport layer 150 may include a quinoline derivative such as, but not limited to, Alq$_3$, 3-(4-biphenylyl)-4-phenyl-5-(4-tertbutylphenyl)-1,2,4-triazole ("TAZ"), Balq, Bebq2 or any combinations thereof.

An electron injection layer 160 is disposed on the electron transport layer 150. The electron injection layer 160 may include a material such as LiF, NaCl, CsF, Li2O or BaO.

The second electrode 170 is disposed on the electron transport layer 150. The second electrode 170 may include a conductive layer having a relatively low work function compared with the first electrode 110. In an exemplary embodiment, the second electrode 170 may include Ag, Mg, Al, Pt, Pd, Au, Ni, Nd, Ir, Cr, Li, Ca or a combination of these materials.

When the OLED 10 is of a bottom-emission type, the second electrode 170 may include one conductive layer having a low work function or a stack of conductive layers having low work functions. Otherwise, the second electrode 170 may be provided by disposing a reflective layer on one or more conductive layers having low work functions. When the OLED 10 is of a top emission type, the second electrode 170 may be provided by providing a conductive layer having a low work function as a thin layer and stacking a transparent conductive layer such as an ITO layer, an IZO layer, a ZnO layer or an indium oxide layer on the conductive layer.

As described above, in the OLED 10 according to the illustrated exemplary embodiment, the trench is defined in the first electrode 110, and the hole injection layer 120 is disposed in the trench. Therefore, hole injection efficiency can be improved, and the hole injection layer 120 and the first electrode 110 can be accurately aligned with each other.

Other exemplary embodiments of the invention will now be described. In the following exemplary embodiments, a description of elements identical to those of the previous exemplary embodiment will be omitted or given briefly, and the following exemplary embodiments will be described focusing mainly on differences with the previous exemplary embodiment.

Figure 2:
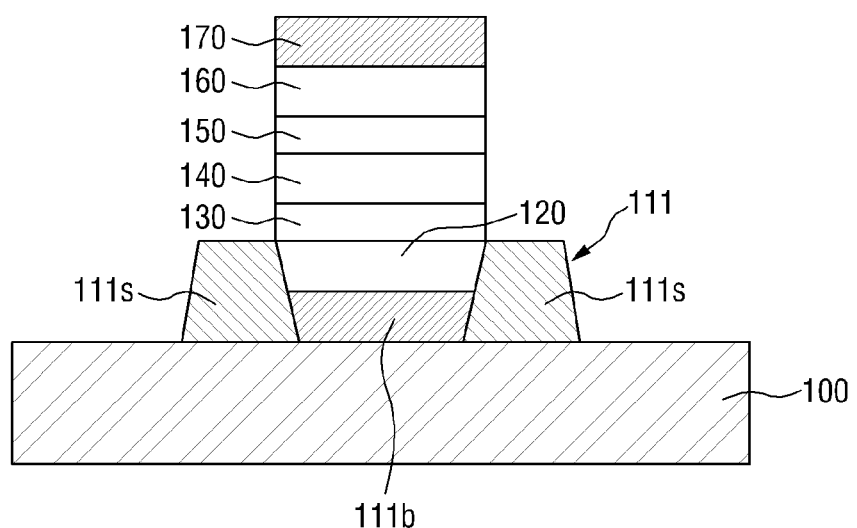
FIG. 2 is a schematic cross-sectional view of another exemplary embodiment of an OLED according to the invention.

FIG. 2 is a schematic cross-sectional view of an OLED 11 according to another exemplary embodiment of the invention. The OLED 11 according to the illustrated exemplary embodiment is different from the OLED 10 according to the exemplary embodiment of FIG. 1 in that a first electrode 111 includes a bottom electrode 111b and sidewall electrodes 111s.

Referring to FIG. 2, the sidewall electrodes 111s and the bottom electrode 111b may include a material having a high work function. In an exemplary embodiment, each of the sidewall electrodes 111s and the bottom electrode 111b may include ITO, IZO, ZnO, indium oxide or any combinations thereof. Further, the sidewall electrodes 111s and the bottom electrode 111b may include the same material.

The sidewall electrodes 111s and the bottom electrode 111b may be disposed on the same layer. The sidewall electrodes 111s may define an opening. The bottom electrode 111b may be disposed in the opening. The bottom electrode 111b may be surrounded by the sidewall electrodes 111s. The sidewall electrodes 111s and the bottom electrode 111b may be electrically connected to each other. Further, the sidewall electrodes 111s and the bottom electrode 111b may physically contact each other.

Top surfaces of the sidewall electrodes 111s may be higher than a top surface of the bottom electrode 111b. In an exemplary embodiment, the sidewall electrodes 111s may be provided thicker than the bottom electrode 111b.

Due to the height difference between the top surfaces of the sidewall electrodes 111s and the top surface of the bottom electrode 111b, a trench of the first electrode 111 may be defined. That is, the trench may be defined by the top surface of the bottom electrode 111b and inner side surfaces of the sidewall electrodes 111s. A hole injection layer 120 may be disposed in the trench and contact all of the bottom electrode 111b and the sidewall electrodes 111s. Therefore, since the hole injection layer 120 can receive holes not only from the bottom electrode 111b but also from the sidewall electrodes 111s, hole injection efficiency can be improved. In addition, since the hole injection layer 120 is disposed in the trench, the hole injection layer 120 and the first electrode 111 can be accurately aligned with each other.

Figure 3:
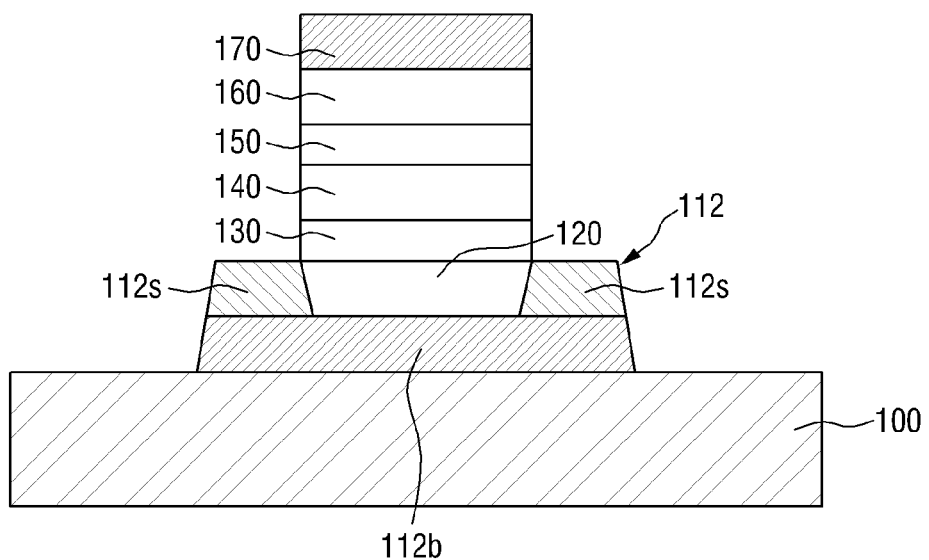
FIG. 3 is a schematic cross-sectional view of another exemplary embodiment of an OLED according to the invention.

FIG. 3 is a schematic cross-sectional view of an OLED 12 according to another exemplary embodiment of the invention. The OLED 12 according to the illustrated exemplary embodiment is different from the OLED 11 according to the exemplary embodiment of FIG. 2 in that sidewall electrodes 112s of a first electrode 112 are disposed on a bottom electrode 112b.

Referring to FIG. 3, the sidewall electrodes 112s are disposed on the bottom electrode 112b and define an opening that at least partially exposes the bottom electrode 112b. Inner side surfaces of the sidewall electrodes 112s and a top surface of the bottom electrode 112b exposed through the opening may define a trench. A hole injection layer 120 may be disposed in the trench.

In the exemplary embodiment shown in FIG. 3, outer side surfaces of the sidewall electrodes 112s are substantially aligned with side surfaces of the bottom electrode 112b. However, the outer side surfaces of the sidewall electrodes 112s may also be disposed further in or out than the side surfaces of the bottom electrode 112b.

In the illustrated exemplary embodiment, since the hole injection layer 120 can receive holes not only from the bottom electrode 112b but also from the sidewall electrodes 112s, hole injection efficiency can be improved. In addition, since the hole injection layer 120 is disposed in the trench, the hole injection layer 120 and the first electrode 112 can be accurately aligned with each other.

Figure 4:
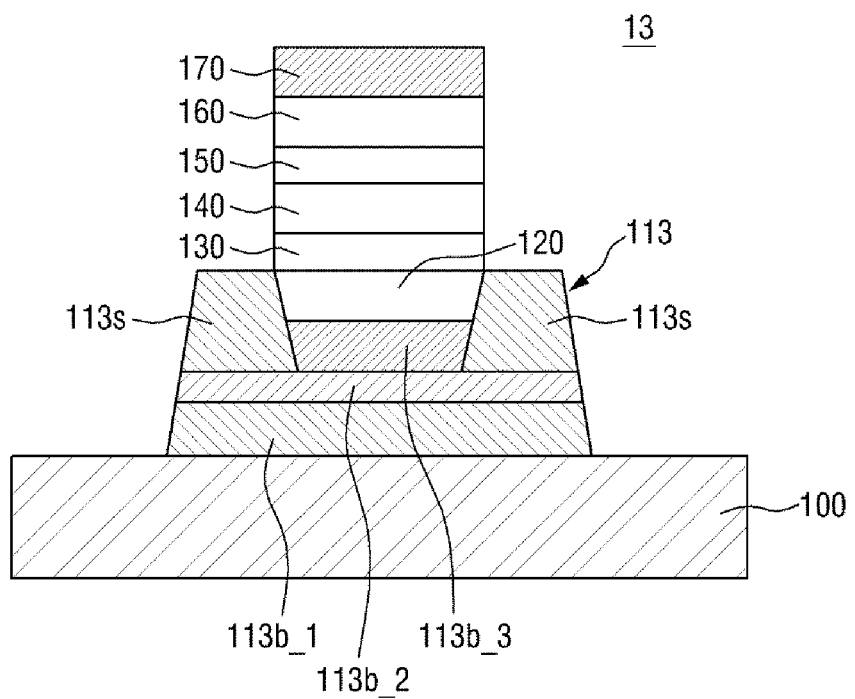
FIG. 4 is a schematic cross-sectional view of another exemplary embodiment of an OLED according to the invention.

FIG. 4 is a schematic cross-sectional view of an OLED 13 according to another exemplary embodiment of the invention. The OLED 13 according to the exemplary embodiment of FIG. 4 may include a combination of the bottom electrode 111b of FIG. 2 and the bottom electrode 112b of FIG. 3.

Referring to FIG. 4, a bottom electrode may include a first bottom electrode 113b_1, a second bottom electrode 113b_2 which is disposed on the first bottom electrode 113b_1 and a third bottom electrode 113b_3 which is disposed on the second bottom electrode 113b_2. Sidewall electrodes 113s are disposed on the second bottom electrode 113b_2. The sidewall electrodes 113s may be disposed on the periphery of the second bottom electrode 113b_2. The sidewall electrodes 113s may define an opening, and a central portion of the second bottom electrode 113b_2 may be exposed by the opening. The third bottom electrode 113b_3 is disposed on the second bottom electrode 113b_2. The third bottom electrode 113b_3 may be surrounded by the sidewall electrodes 113s.

Top surfaces of the sidewall electrodes 113s may be higher than a top surface of the third bottom electrode 113b_3. In an exemplary embodiment, the sidewall electrodes 113s may be provided thicker than the third bottom electrode 113b_3.

Due to the height difference between the top surfaces of the sidewall electrodes 113s and the top surface of the third bottom electrode 113b_3, a trench of the first electrode 113 may be defined. That is, the trench may be defined by the top surface of the third bottom electrode 113b_3 and inner side surfaces of the sidewall electrodes 113s.

The sidewall electrodes 113s and the third bottom electrode 113b_3 may include a material having a high work function. In an exemplary embodiment, each of the sidewall electrodes 113s and the third bottom electrode 113b_3 may include ITO, IZO, ZnO, indium oxide or any combinations thereof. Further, the third sidewall electrodes 113s and the third bottom electrode 113b_3 may include the same material.

The first bottom electrode 113b_1 and the second bottom electrode 113b_2 should be conductive enough to effectively reduce resistance of the first electrode 113. However, since the first bottom electrode 113b_1 and the second bottom electrode 113b_2 do not directly contact a hole injection layer 120, the first bottom electrode 113b_1 and the second bottom electrode 113b_2 do not need to include a material having a high work function. Therefore, not only the above exemplary materials having high work functions but also materials having relatively low work functions such as Ag, Mg, Al, Pt, Pd, Au, Ni, Nd, Ir, Cr, Li and Ca are applicable.

When the OLED 13 is a top-emission type OLED, at least one of the first bottom electrode 113b_1 and the second bottom electrode 113b_2 may include a material having superior reflexibility. In an exemplary embodiment, the second bottom electrode 113b_2 may include a material having superior reflexibility such as Ag, Mg, Al, Pt, Pd, Au, Ni, Nd, Ir, Cr, Li or Ca, and the first bottom electrode 113b_1 and the third bottom electrode 113b_3 may include substantially the same material.

In the illustrated exemplary embodiment, the hole injection layer 120 may be disposed in the trench and contact all of the third bottom electrode 113b_3 and the sidewall electrodes 113s. Therefore, since the hole injection layer 120 can receive holes not only from the third bottom electrode 113b_3 but also from the sidewall electrodes 113s, hole injection efficiency can be improved. In addition, since the hole injection layer 120 is disposed in the trench, the hole injection layer 120 and the first electrode 113 can be accurately aligned with each other.

In other exemplary embodiments, any one of the first bottom electrode 113b_1 and the second bottom electrode 113b_2 can be omitted.

Figure 5:
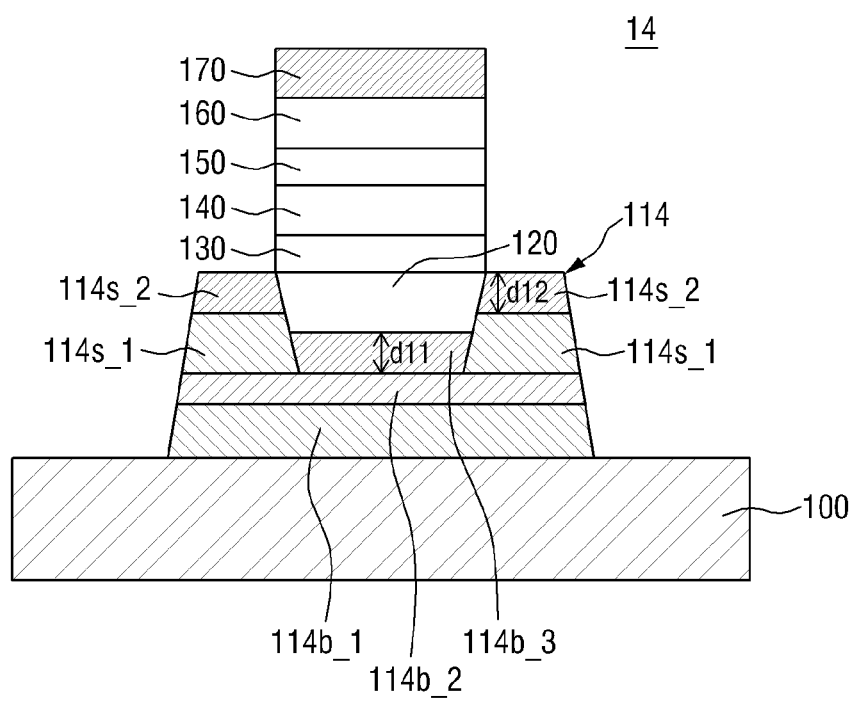
FIG. 5 is a schematic cross-sectional view of another exemplary embodiment of an OLED according to the invention.

FIG. 5 is a schematic cross-sectional view of an OLED 14 according to another exemplary embodiment of the invention. The OLED 14 according to the illustrated exemplary embodiment is different from the OLED 13 according to the exemplary embodiment of FIG. 4 in that a first electrode 114 includes first sidewall electrodes 114s_1 and second sidewall electrodes 114s_2. A bottom electrode includes a first bottom electrode 114b_1, a second bottom electrode 114b_2 and a third bottom electrode 114b_3.

Referring to FIG. 5, the second sidewall electrodes 114s_2 are disposed on the first sidewall electrodes 114s_1. A thickness d12 of the second sidewall electrodes 114s_2 may be substantially equal to a thickness d11 of the third bottom electrode 114b_3. A thickness of the first sidewall electrodes 114s_1 may be greater than the thickness d11 of the third bottom electrode 114b_3.

In addition, the second sidewall electrodes 114s_2 may include substantially the same material as the third bottom electrode 114b_3. Further, the second sidewall electrodes 114s_2 may include the same material as the first sidewall electrodes 114s_1.

In the illustrated exemplary embodiment, a trench of the first electrode 114 may be defined by the third bottom electrode 114b_3, inner side surfaces of the first sidewall electrodes 114s_1, and inner side surfaces of the second sidewall electrodes 114s_2. A hole injection layer 120 may be disposed in the trench of the first electrode 114, and, accordingly, may contact not only the third bottom electrode 114b_3 but also the first sidewall electrodes 114s_1 and the second sidewall electrodes 114s_2. Therefore, hole injection efficiency can be improved, and the hole injection layer 120 and the first electrode 114 can be accurately aligned with each other.

Figure 6:
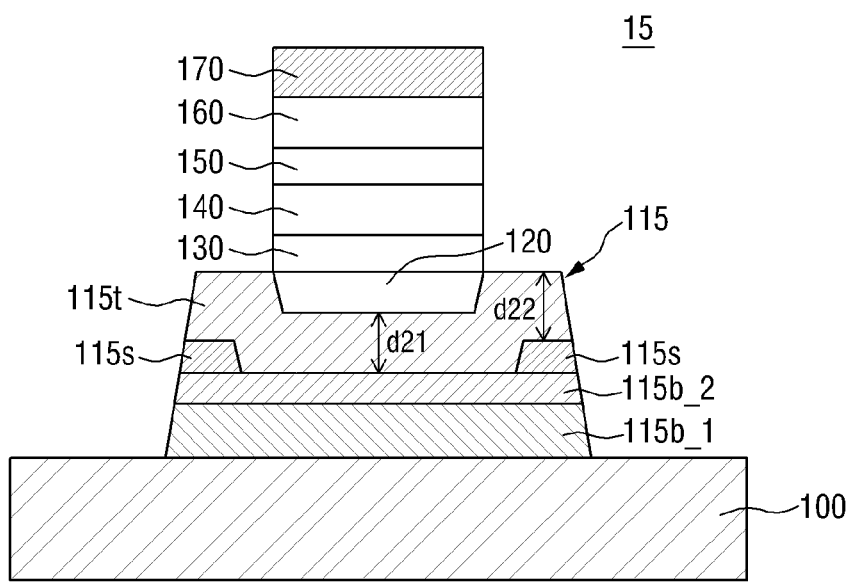
FIG. 6 is a schematic cross-sectional view of another exemplary embodiment of an OLED according to the invention.

FIG. 6 is a schematic cross-sectional view of an OLED 15 according to another exemplary embodiment of the invention. In the illustrated exemplary embodiment, the second sidewall electrodes 114s_2 and the third bottom electrode 114b_3 shown in FIG. 5 are integrally provided with each other.

More specifically, referring to FIG. 6, the OLED 15 according to the illustrated exemplary embodiment includes sidewall electrodes 115s and a trench electrode 115t disposed on a second bottom electrode 115b_2. The second bottom electrode 115b_2 is disposed on a first bottom electrode 115b_1. The trench electrode 115t includes sidewalls disposed on the sidewall electrodes 115s and a bottom portion disposed on the second bottom electrode 115b_2. The sidewalls and the bottom portion are physically connected to each other. Outer side surfaces of the sidewalls may be aligned with outer side surfaces of the sidewall electrodes 115s.

A thickness d22 of the sidewalls may be substantially equal to a thickness d21 of the bottom portion. In the exemplary embodiment shown in FIG. 6, a thickness of the trench electrode 115t is greater than a thickness of the sidewall electrodes 115s. However, the thickness of the trench electrode 115t may also be equal to or smaller than the thickness of the sidewall electrodes 115s.

Inner side surfaces of the sidewalls of the trench electrode 115t and a top surface of the bottom portion of the trench electrode 115t may define a trench, and a hole injection layer 120 may be disposed in the trench.

In the illustrated exemplary embodiment, the trench of the first electrode 115 may be defined by the top surface of the bottom portion of the trench electrode 115t and the inner side surfaces of the sidewalls of the trench electrode 115t. The hole injection layer 120 may be disposed in the trench of the first electrode 115, and, accordingly, may contact not only the top surface of the bottom portion but also the inner side surfaces of the sidewalls of the trench electrode 115t. Therefore, hole injection efficiency can be improved, and the hole injection layer 120 and the first electrode 115 can be accurately aligned with each other.

Figure 7:
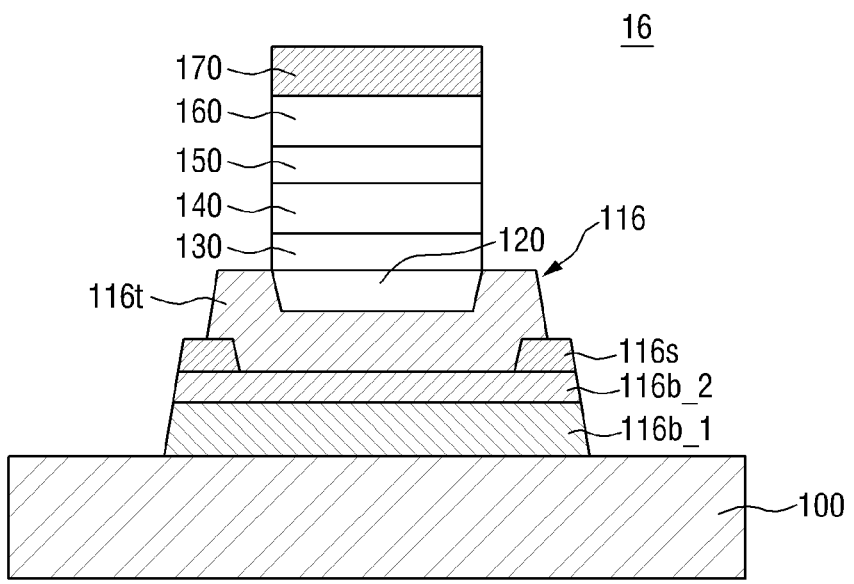
FIG. 7 is a schematic cross-sectional view of another exemplary embodiment of an OLED according to the invention.

FIG. 7 is a schematic cross-sectional view of an OLED 16 according to another exemplary embodiment of the invention. Referring to FIG. 7, the OLED 16 according to the illustrated exemplary embodiment is different from the OLED 15 according to the exemplary embodiment of FIG. 6 in that outer side surfaces of sidewalls of a trench electrode 116t are not aligned with outer side surfaces of sidewall electrodes 116s but are disposed further in than the outer side surfaces of the sidewall electrodes 116s. That is, the outer side surfaces of the sidewalls of the trench electrode 116t may be disposed on top surfaces of the sidewall electrodes 116s and may be separated inwards from the outer side surfaces of the sidewall electrodes 116s.

A second bottom electrode 116b_2 is disposed on a first bottom electrode 116b_1.

In the illustrated exemplary embodiment, a hole injection layer 120 may also be disposed in the trench of a first electrode 116, and, accordingly, may contact not only a top surface of a bottom portion but also inner side surfaces of the sidewalls of the trench electrode 116t. Therefore, hole injection efficiency can be improved, and the hole injection layer 120 and the first electrode 116 can be accurately aligned with each other.

FIGS. 8 to 12 are schematic cross-sectional views of OLEDs 17 to 21 according to various exemplary embodiments of the invention. In FIGS. 8 to 12, various placements of a hole injection layer that fills a trench are illustrated.

Figure 8:
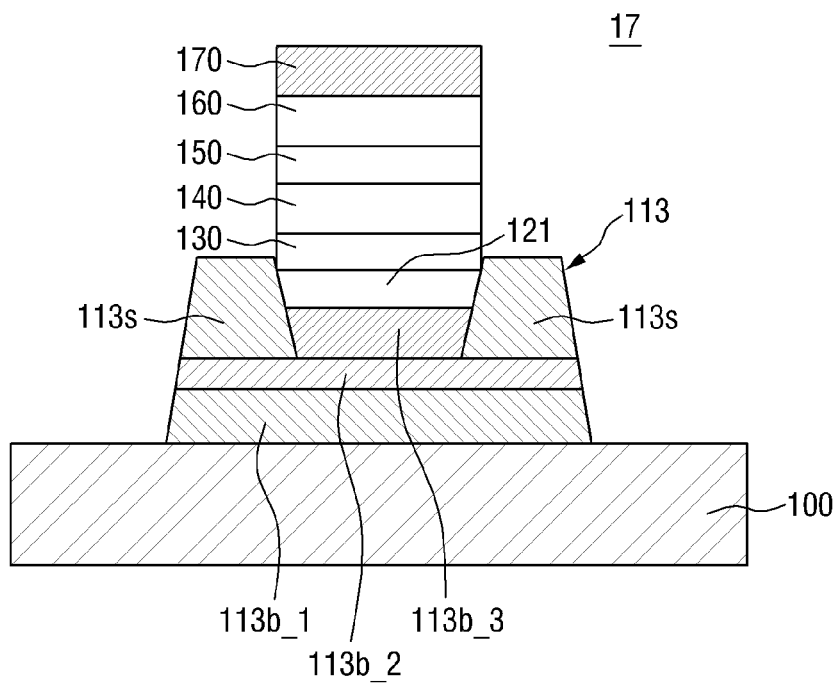
FIGS. 8 through 12 are schematic cross-sectional views of various exemplary embodiments of OLEDs according to the invention.

Referring to FIG. 8, the OLED 17 is different from the OLED 13 according to the exemplary embodiment of FIG. 4 in that a thickness of a hole injection layer 121 is smaller than a depth of a trench. Top surfaces of sidewall electrodes 113s protrude relatively further than a top surface of the hole injection layer 121. In addition, a hole transport layer 130 is disposed on the hole injection layer 121 as in FIG. 4, but a part of the hole transport layer 130 is disposed in the trench.

Figure 9:
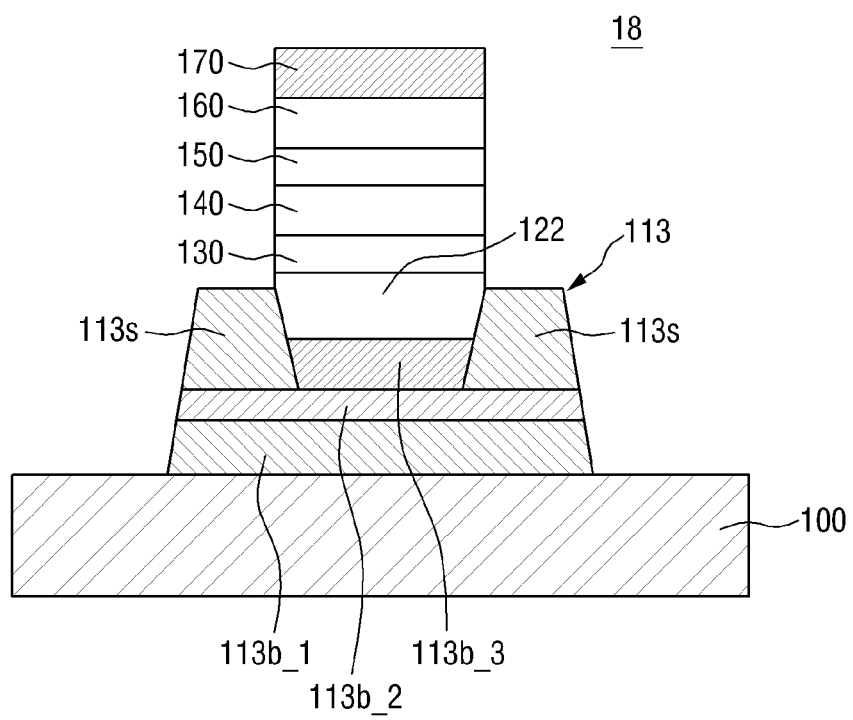

Referring to FIG. 9, the OLED 18 is different from the OLED 13 according to the exemplary embodiment of FIG. 4 in that a thickness of a hole injection layer 122 is greater than a depth of a trench. A top surface of the hole injection layer 122 protrudes relatively further than top surfaces of sidewall electrodes 113s. A distance between a hole transport layer 130 and a first electrode 113 may be greater in the illustrated exemplary embodiment than the distance between a hole transport layer 130 and a first electrode 113 in the exemplary embodiment of FIG. 4 or 8.

Figure 10:
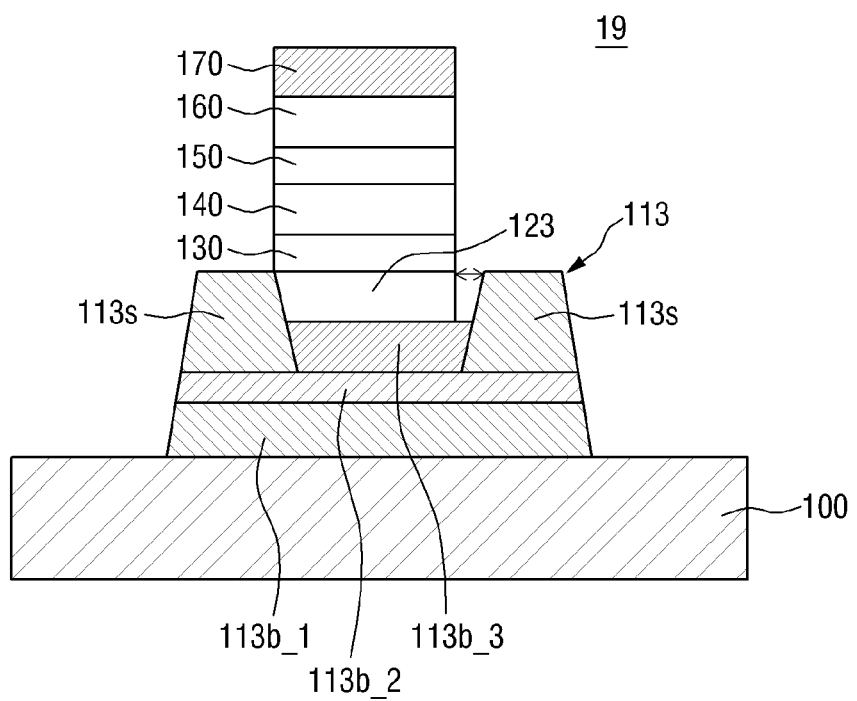

Referring to FIG. 10, the OLED 19 is different from the OLED 13 according to the exemplary embodiment of FIG. 4 in that a hole injection layer 123 contacts not all of inner side surfaces of sidewall electrodes 113s but is separated from at least one of the inner side surfaces of the sidewall electrodes 113s. In the illustrated exemplary embodiment, holes are not injected directly to a portion of the hole injection layer 123 which is separated from the inner side surfaces of the sidewall electrodes 113s but are injected directly to a portion of the hole injection layer 123 which contacts the inner side surfaces of the sidewall electrodes 113s. Therefore, hole injection efficiency can be improved compared with when the hole injection layer 123 contacts only a third bottom electrode 113b_3.

Figure 11:
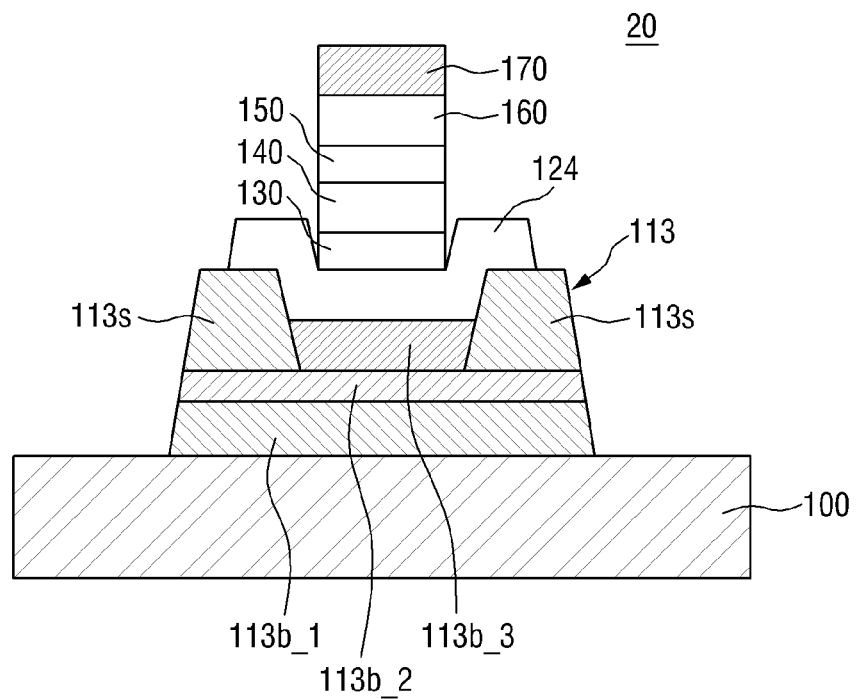

Referring to FIG. 11, the OLED 20 is different from the OLED 13 according to the exemplary embodiment of FIG. 4 in that a hole injection layer 124 not only fills a trench of a first electrode 113 but extends onto top surfaces of sidewall electrodes 113s. A thickness of the hole injection layer 124 may be uniform. That is, the hole injection layer 124 may be conformably provided with a uniform thickness along a pattern of the trench thereunder. Therefore, a thickness of a portion of the hole injection layer 124 which is disposed in the trench may be equal to a thickness of portions of the hole injection layer 124 which are disposed on the top surfaces of the sidewall electrodes 113s.

In the illustrated exemplary embodiment, since the hole injection layer 124 can receive holes not only from a top surface of the third bottom electrode 113b_3 but also from the inner side surfaces of the sidewall electrodes 113s and the top surfaces of the sidewall electrodes 113s, hole injection efficiency can be improved.

Figure 12:
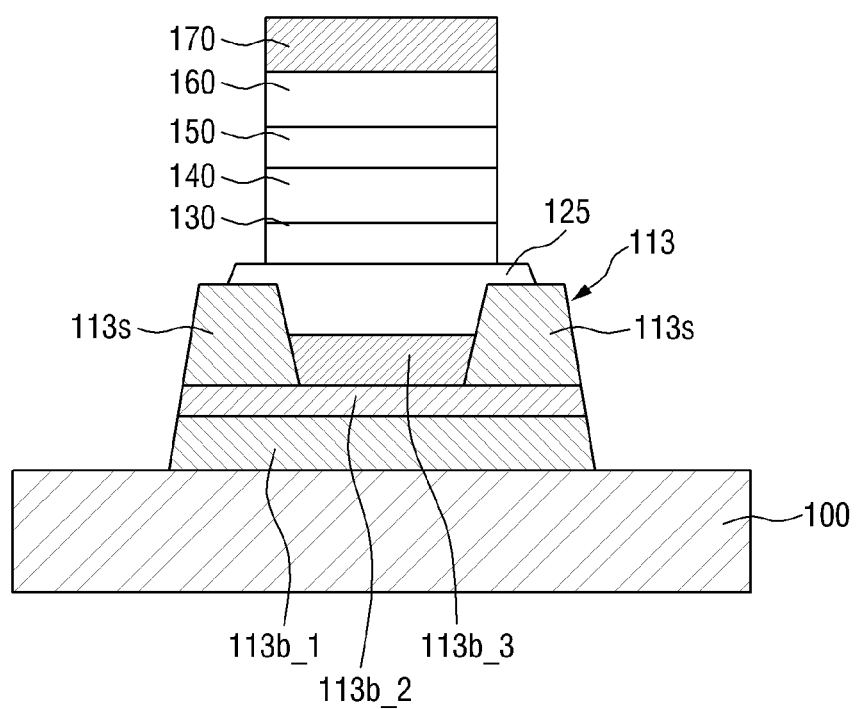

Referring to FIG. 12, the OLED 21 is the same as the OLED 20 according to the exemplary embodiment of FIG. 11 in that a hole injection layer 125 extends onto top surfaces of sidewall electrodes 113s, but is different from the OLED 20 according to the exemplary embodiment of FIG. 11 in that a thickness of the hole injection layer 125 in a trench is greater than a thickness of the hole injection layer 125 on the top surfaces of the sidewall electrodes 113s. In an exemplary embodiment, a top surface of the hole injection layer 125 on the top surfaces of the sidewall electrodes 113s may be at the same height as a top surface of the hole injection layer 125 in the trench. That is, the top surface of the hole injection layer 125 may be substantially flat. However, a shape of the top surface of the hole injection layer 125 is not limited thereto, and the top surface of the hole injection layer 125 in the trench may be relatively lower as described in FIG. 11.

In the illustrated exemplary embodiment, since the hole injection layer 125 can receive holes not only from a top surface of a third bottom electrode 113b_3 but also from inner side surfaces of the sidewall electrodes 113s and the top surfaces of the sidewall electrodes 113s, hole injection efficiency can be improved.

Figure 13:
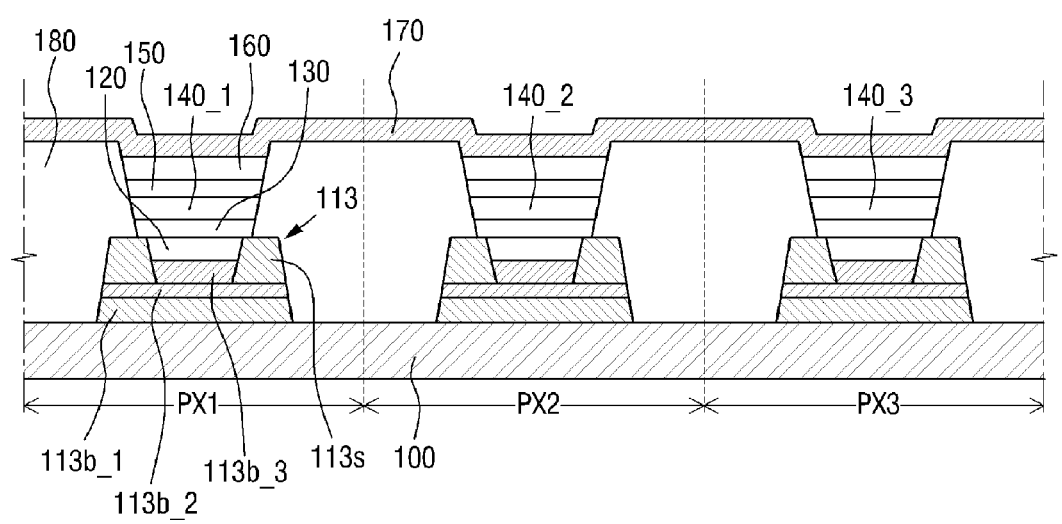
FIG. 13 is a cross-sectional view of another exemplary embodiment of an OLED according to the invention.

FIG. 13 illustrates a structure in which the above-described exemplary embodiments are applied to an OLED including a plurality of pixels.

FIG. 13 is a cross-sectional view of an OLED 22 according to another exemplary embodiment of the invention. Referring to FIG. 13, the OLED 22 includes a plurality of pixels (PX1, PX2, PX3).

The pixels (PX1, PX2, PX3) are defined on a substrate 100. A first electrode 113 may be disposed in each of the pixels (PX1, PX2, PX3) on the substrate 100. In the exemplary embodiment shown in FIG. 13, the first electrode 113 of FIG. 4 is applied as the first electrode 113. However, first electrodes according to other various exemplary embodiments of the invention can also be applied.

The first electrodes 113 of different pixels (PX1, PX2, PX3) may be pixel electrodes which are electrically and physically separated from each other.

A pixel defining layer 180 may be disposed on the first electrodes 113. The pixel defining layer 180 may be disposed at a boundary of each pixel (PX1, PX2, PX3). The pixel defining layer 180 may define openings which partially expose the first electrodes 113, respectively. The openings of the pixel defining layer 180 may overlap the first electrodes 113 and thus expose trenches of the first electrodes 113, respectively.

Sidewalls of the pixel defining layer 180 which define the openings may be aligned with inner side surfaces of sidewall electrodes 113s which form the trenches of the first electrodes 113 but may be disposed further out than the inner side surfaces of the sidewall electrodes 113s. That is, as shown in FIG. 13, the sidewalls of the pixel defining layer 180 may be disposed on top surfaces of the sidewall electrodes 113s.

The pixel defining layer 180 may include an inorganic material, an organic material, or a combination of the inorganic material and the organic material. The pixel defining layer 180 may include, e.g., silicon oxide ($SiO_2$), silicon nitride (SiNx), silicon oxynitride, an acrylic organic compound, polyamide, or polyimide. The pixel defining layer 180 shown in FIG. 13 is a single layer. However, the pixel defining layer 180 may also include a stack of the same or different material layers.

A hole injection layer 120 is disposed on each of the first electrodes 113. The hole injection layer 120 is disposed in each of the trenches of the first electrodes 113 to improve hole injection efficiency as described in the exemplary embodiment of FIG. 4.

A hole transport layer 130 is disposed on the hole injection layer 120. In FIG. 13, the hole transport layer 130 is disposed in each of the openings defined by the pixel defining layer 180. However, the hole transport layer 130 may also be a common layer for all pixels (PX1, PX2, PX3).

Organic light-emitting layers (140_1, 140_2, 140_3) are disposed on the hole transport layer 130. The organic light-emitting layers (140_1, 140_2, 140_3) may include organic light-emitting materials of different colors for different pixels (PX1, PX2, PX3). In an exemplary embodiment, an organic light-emitting layer 140_1 of a first pixel PX1 may include a red organic light-emitting material, an organic light-emitting layer 140_2 of a second pixel PX2 may include a green organic light-emitting material, and an organic light-emitting layer 140_3 of a third pixel PX3 may include a blue organic light-emitting material.

An electron transport layer 150 and an electron injection layer 160 are sequentially disposed on the organic light-emitting layers (140_1, 140_2, 140_3). A second electrode 170 is disposed on the electron injection layer 160. In an exemplary embodiment, the electron transport layer 150 and the electron injection layer 160 are disposed in each of the openings defined by the pixel defining layer 180, but the second electrode 170 may extend onto the pixel defining layer 180. That is, the second electrode 170 may be a common electrode for each of the pixels (PX1, PX2, PX3). In some other exemplary embodiments, each of the electron transport layer 150 and the electron injection layer 160 may also be a common layer for each of the pixels (PX1, PX2, PX3).

The above-described exemplary embodiments can be combined in various ways.

Methods of manufacturing the above-described OLEDs will hereinafter be described.

FIGS. 14 through 17 are cross-sectional views illustrating operations in a method of manufacturing an OLED according to an exemplary embodiment of the invention. FIGS. 14 through 17 are related to an exemplary embodiment of a manufacturing method of the OLED 13 of FIG. 4.

Figure 14:
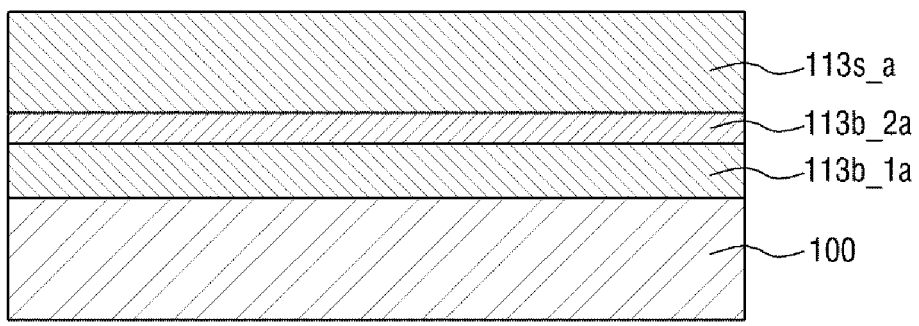
FIGS. 14 through 17 are cross-sectional views illustrating an exemplary embodiment of operations in a method of manufacturing an OLED according to the invention.

Referring to FIG. 14, a first bottom electrode layer 113b_1a, a second bottom electrode layer 113b_2a and a sidewall electrode layer 113s_a are sequentially disposed on a substrate 100. The first bottom electrode layer 113b_1a may include ITO, IZO, ZnO, indium oxide or any combinations thereof. The second bottom electrode layer 113b_2a may include Al, Pt, Pd, Au, Ni, Nd, Ir, Cr, Li, Ca or any combinations thereof. The sidewall electrode layer 113s_a may include the same material as that of the first bottom electrode layer 113b_1a.

Figure 15:
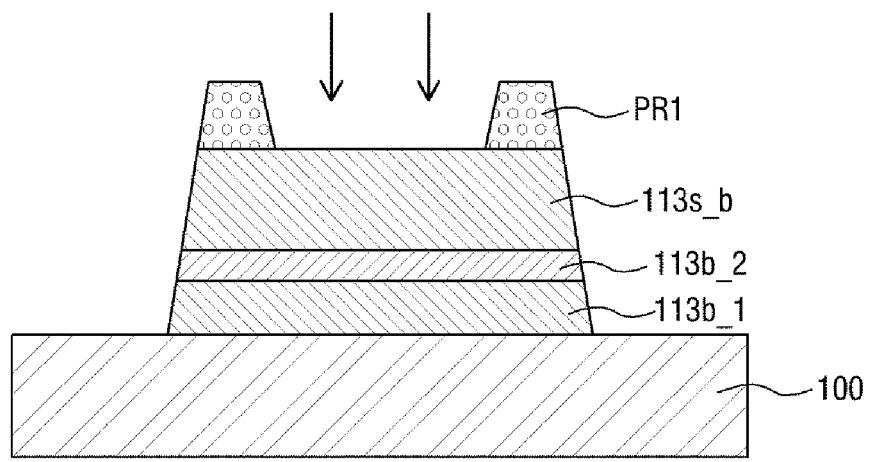

Referring to FIG. 15, the sidewall electrode layer 113s_a, the second bottom electrode layer 113b_2a and the first bottom electrode layer 113b_1a are sequentially patterned to provide a first electrode pattern.

Then, a photoresist pattern PR1 is disposed on the sidewall electrode layer 113s_b of the first electrode pattern to define an opening. The photoresist pattern PR1 may be different from a photoresist pattern used to provide the first electrode pattern or may be a residue of the photoresist pattern used to provide the first electrode pattern. In an exemplary embodiment, when the first electrode pattern is provided, a thickness of the photoresist pattern may be adjusted by adjusting exposure using a slit mask or a semi-transmissive mask. Then, an etching process may be performed using this photoresist pattern. As a result, the photoresist pattern PR1 may be left as shown in FIG. 15 after providing the first electrode pattern.

Figure 16:
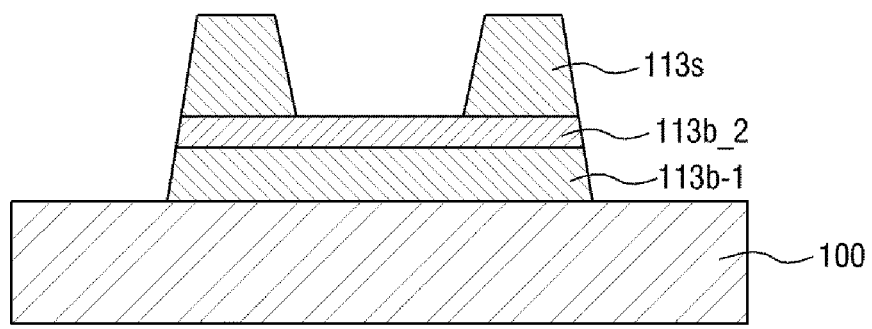

Referring to FIG. 16, the sidewall electrode layer 113s_b is etched using the photoresist pattern PR1 as an etch mask, thereby the sidewall electrode layer 113s etched from the sidewall electrode layer 113s_b exposes the second bottom electrode layer 113b_2.

Figure 17:
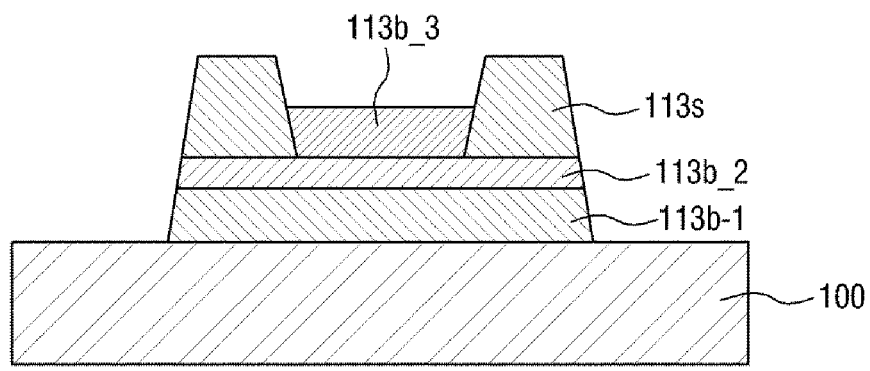

Referring to FIG. 17, the photoresist pattern PR1 is removed, and a third bottom electrode layer 113b_3 is disposed on the second bottom electrode layer 113b_2 exposed by the sidewall electrode layer 113s.

Specifically, a third bottom electrode layer 113b_3 may be disposed on the whole surface of the substrate 100 and then patterned. In another exemplary embodiment, the third bottom electrode layer may be selectively stacked on the second bottom electrode layer 113b_2 exposed by the sidewall electrode layer 113s using an inkjet printing method.

As a resultant structure of FIG. 17, a first electrode including a trench is completed. Then, a hole injection layer is disposed in the trench of the first electrode by, e.g., an inkjet printing method. Since the hole injection layer is disposed in the trench of the first electrode, the hole injection layer and the first electrode can be accurately aligned with each other.

The OLED 13 of FIG. 4 is completed by providing a hole transport layer 130, an organic light-emitting layer 140, an electron transport layer 150, an electron injection layer 160 and a second electrode 170 using a method known to the art to which the invention pertains.

Figure 18:
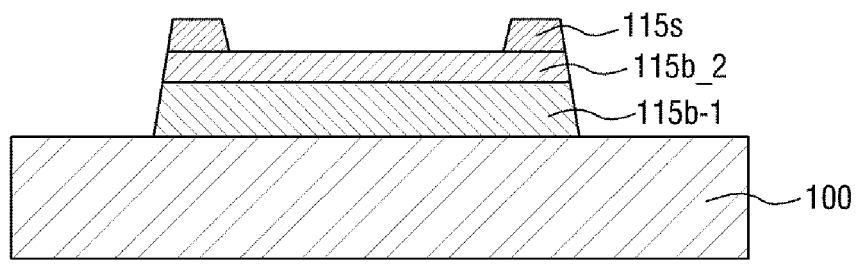
FIGS. 18 through 20 are cross-sectional views illustrating another exemplary embodiment of operations in a method of manufacturing an OLED according to the invention.
Figure 19:
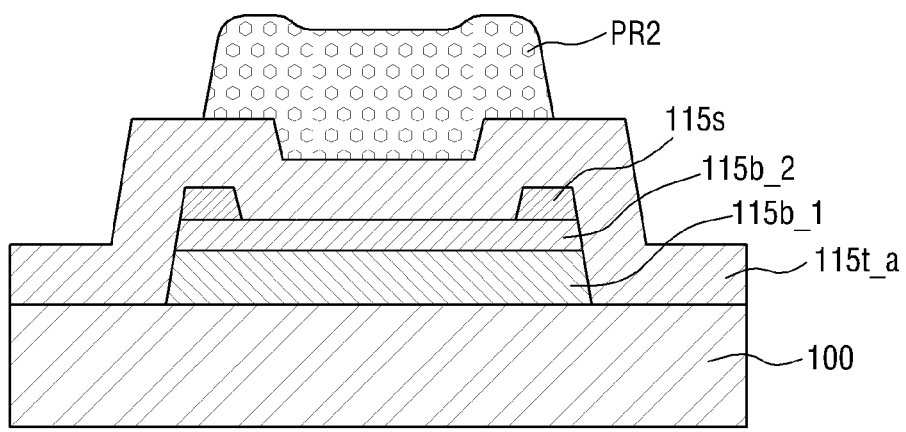
Figure 20:
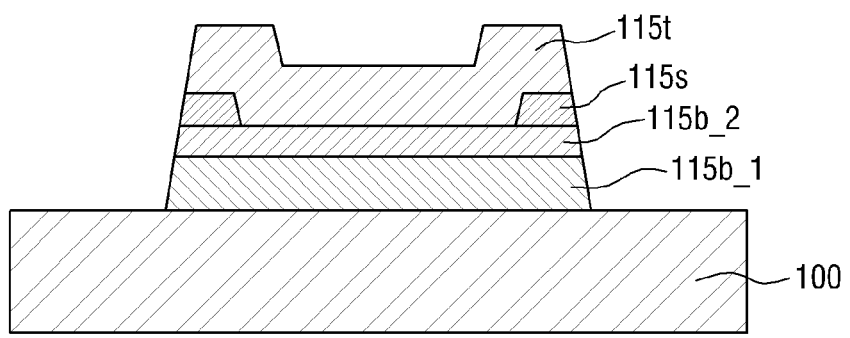

FIGS. 18 through 20 are cross-sectional views illustrating operations in a method of manufacturing an OLED according to another exemplary embodiment of the invention. FIGS. 18 through 20 are related to an exemplary method of manufacturing the OLED 15 of FIG. 6.

Referring to FIG. 18, a first bottom electrode layer 115b_1, a second bottom electrode layer 115b_2 and a sidewall electrode layer 115s are disposed on a substrate 100 and then patterned to provide a first electrode pattern. After the formation of the first electrode pattern, the sidewall electrode layer 115s is etched using a photoresist pattern as an etch mask to expose the second bottom electrode layer 115b_2. The above-described operations are substantially the same as those described above with reference to FIGS. 14 through 17. However, the sidewall electrode layer 115s may be provided thinner than the sidewall electrode layer 113s of FIGS. 14 through 17, considering that a trench electrode 115t will be disposed on the sidewall electrode layer 115s.

Referring to FIG. 19, a trench electrode layer 115t_a is disposed on the whole surface of the substrate 100. The trench electrode layer 115t_a may include the same material as the sidewall electrode layer 115s.

Then, a photoresist pattern PR2 is disposed on the trench electrode layer 115t_a to cover the first electrode pattern.

Referring to FIG. 20, an exposed portion of the trench electrode layer 115t_a is etched and removed by using the photoresist pattern PR2 as an etch mask. Then, the photoresist pattern PR2 is removed.

Next, a hole injection layer 120 is disposed in a trench of a trench electrode 115t. Finally, the OLED 15 of FIG. 6 is completed by providing a hole transport layer 130, an organic light-emitting layer 140, an electron transport layer 150, an electron injection layer 160 and a second electrode 170 using a method known to the art to which the invention pertains.

Exemplary embodiments of the invention provide at least one of the following advantages.

That is, it is possible to place a hole injection layer at an exact position and improve hole injection efficiency.

However, the effects of the invention are not restricted to the one set forth herein. The above and other effects of the invention will become more apparent to one of daily skill in the art to which the invention pertains by referencing the claims.

In concluding the detailed description, those skilled in the art will appreciate that many variations and modifications can be made to the preferred exemplary embodiments without substantially departing from the principles of the invention. Therefore, the disclosed preferred exemplary embodiments of the invention are used in a generic and descriptive sense only and not for purposes of limitation.

What is claimed is:

1. An organic light-emitting diode display comprising:
 a substrate;
 a first electrode which is disposed on the substrate, a trench defined in a top surface of the first electrode; and
 a hole injection layer which is disposed in the trench.

2. The organic light-emitting diode display of claim 1, wherein
 the first electrode comprises a bottom portion and sidewalls, and
 the trench is defined by a top surface of the bottom portion and inner side surfaces of the sidewalls.

3. The organic light-emitting diode display of claim 1, wherein the first electrode comprises a bottom electrode and sidewall electrodes.

4. The organic light-emitting diode display of claim 3, wherein the sidewall electrodes define an opening, and the bottom electrode is disposed in the opening.

5. The organic light-emitting diode display of claim 4, wherein the trench is defined by inner side surfaces of the sidewall electrodes and a top surface of the bottom electrode.

6. The organic light-emitting diode display of claim 4, wherein the sidewall electrodes comprise first sidewall electrodes, and second sidewall electrodes disposed on the first sidewall electrodes.

7. The organic light-emitting diode display of claim 6, wherein a thickness of the bottom electrode is equal to a thickness of the second sidewall electrodes.

8. The organic light-emitting diode display of claim 3, wherein the sidewall electrodes are disposed on the bottom electrode.

9. The organic light-emitting diode display of claim 8, wherein the trench is defined by inner side surfaces of the sidewall electrodes and a top surface of the bottom electrode.

10. The organic light-emitting diode display of claim 1, wherein the first electrode comprises sidewall electrodes which define an opening and a trench electrode which is disposed on the sidewall electrodes.

11. The organic light-emitting diode display of claim 10, wherein the trench electrode comprises sidewalls which are disposed on the sidewall electrodes and a bottom portion which is disposed in the opening.

12. The organic light-emitting diode display of claim 1, further comprising:
   an organic light-emitting layer which is disposed on the hole injection layer, and
   a second electrode which is disposed on the organic light-emitting layer.

13. An organic light-emitting diode display comprising:
   a substrate;
   a plurality of pixels which is defined on the substrate;
   a first electrode which is disposed on the substrate in each of the pixels, and a trench defined in a top surface of the first electrode;
   a pixel defining layer which is disposed on the first electrode at a boundary of each pixel and defines openings, each exposing the trench of the first electrode;
   a hole injection layer which is disposed in the trench of the first electrode;
   an organic light-emitting layer which is disposed on the hole injection layer; and
   a second electrode which is disposed on the organic light-emitting layer.

14. The organic light-emitting diode display of claim 13, wherein the organic light-emitting layer is disposed in each of the openings of the pixel defining layer.

15. The organic light-emitting diode display of claim 14, wherein the second electrode extends onto the pixel defining layer and is provided as a single piece over each of the pixels.

16. A method of manufacturing an organic light-emitting diode display, the method comprising:
   disposing a first electrode, in which a trench is defined in a top surface thereof, on a substrate; and
   disposing a hole injection layer in the trench.

17. The method of claim 16, wherein the disposing the first electrode comprises:
   disposing sidewall electrodes, which define an opening, on the substrate; and
   disposing a bottom electrode in the opening defined by the sidewall electrodes.

18. The method of claim 16, wherein the disposing the first electrode comprises:
   disposing first sidewall electrodes, which define an opening, on the substrate;
   disposing second sidewall electrodes on the first sidewall electrodes; and
   disposing a bottom electrode in the opening.

19. The method of claim 16, wherein the disposing the first electrode comprises:
   disposing sidewall electrodes, which define an opening, on the substrate; and
   disposing a trench electrode, which comprises sidewalls on the sidewall electrodes and a bottom portion in the opening.

20. The method of claim 16, wherein the disposing the first electrode comprises:
   disposing a bottom electrode on the substrate; and
   disposing sidewall electrodes on the bottom electrode to define an opening which exposes the bottom electrode.

21. The organic light-emitting diode display of claim 1, wherein a thickness of a portion of the first electrode in which the trench is defined is less than a thickness of a remaining portion of the first electrode.

* * * * *